(12) United States Patent
Muddu

(10) Patent No.: US 6,532,575 B1
(45) Date of Patent: Mar. 11, 2003

(54) METHOD AND SYSTEM FOR CALCULATING INTERCONNECT MOMENTS AND DELAY

(75) Inventor: Sudhakar Muddu, Milpitas, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 190 days.

(21) Appl. No.: 09/660,732

(22) Filed: Sep. 13, 2000

(51) Int. Cl.[7] .................................................. G06F 9/45

(52) U.S. Cl. ...................... 716/6; 716/1; 716/4; 716/5

(58) Field of Search ................................ 716/6, 5, 4, 1

(56) References Cited

PUBLICATIONS

Lehther et al, "Moment–Based Techniques for RLC Clock Tree Construction", IEEE, Jan. 1998.*

* cited by examiner

*Primary Examiner*—Vuthe Siek
*Assistant Examiner*—Brandon Bowers
(74) *Attorney, Agent, or Firm*—Baker Botts L.L.P.

(57) ABSTRACT

A system and method for calculating interconnect response and delay are disclosed. The admittance of the nodes of an interconnect is determined from the attributes of the nodes. Weighted admittance of the nodes are determined from the admittance, and transfer function coefficients are determined the weighted admittance. A transfer function is determined from the transfer function coefficients, and is used to calculate an interconnect delay.

29 Claims, 3 Drawing Sheets

METHOD AND SYSTEM FOR CALCULATING INTERCONNECT MOMENTS AND DELAY

TECHNICAL FIELD OF THE INVENTION

This invention relates generally to the field of circuit design and more specifically to a method and system for calculating interconnect moments and delay.

BACKGROUND OF THE INVENTION

Accurate calculation of propagation delay due to circuit interconnects is critical to the design of high speed integrated circuits. Signal paths include the interconnects between the gates of an integrated circuit. The resistive, capacitive, and inductive attributes of the interconnects form gate loads that contribute to signal delay. Accurate calculation of interconnect delays, however, is often time-consuming and expensive. Accordingly, calculating interconnect delay has posed a challenge for integrated circuit designers.

SUMMARY OF THE INVENTION

While known approaches have provided improvements over prior approaches, the challenges in the field of circuit design have continued to increase with demands for more and better techniques having greater efficiency. Therefore, a need has arisen for a new method and system for calculating interconnect response and delay.

In accordance with the present invention, a method and system for calculating interconnect response and delay are provided that substantially eliminate or reduce the disadvantages and problems associated with previously developed systems and methods.

According to one embodiment of the present invention, method for calculating interconnect response and delay is disclosed. An interconnect has more than one node. At least one attribute for each node of the interconnect is determined. An admittance of each node is determined from the attributes. A transfer function coefficient for each node is determined by repeatedly calculating a weighted admittance of a current node from the admittance of the node, and calculating a transfer function coefficient of a next node from the weighted admittance. A transfer function of a predetermined order is determined from the transfer function coefficients. An interconnect response is determined from the transfer function. More specifically, an interconnect delay is determined from the transfer function.

According to another embodiment of the present invention, system for calculating interconnect response and delay is disclosed. A parameter module determines at least one attribute for each node of an interconnect. An admittance module determines an admittance of each node from the attributes. A weighted admittance module calculates a weighted admittance of a node from the admittance of the node. A transfer function module calculates a transfer function coefficient for each node from the weighted admittance and determines a transfer function of a predetermined order from the transfer function coefficients. A response module calculates an interconnect response according to the transfer function. More specifically, a delay module calculates an interconnect delay according to the transfer function.

According to another embodiment of the present invention, interconnect response and delay calculation software embodied in a computer-readable medium is disclosed. The software determines at least one attribute for each node of an interconnect, and determines an admittance of each node from the attributes. A transfer function coefficient for each node is determined by repeatedly calculating a weighted admittance of a current node from the admittance of the node, and calculating a transfer function coefficient of a next node from the weighted admittance. A transfer function of a predetermined order is determined from the transfer function coefficients. An interconnect response is determined from the transfer function. More specifically, an interconnect delay is determined from the transfer function.

Embodiments of the invention may provide numerous technical advantages. A technical advantage of one embodiment is that an admittance of each node is recursively calculated from the attributes of an interconnect. Recursive calculation of the admittance may provide faster calculation of interconnect response and delay than calculating the admittance separately for each individual node. Another technical advantage of one embodiment is that transfer function coefficients are determined by repeatedly calculating weighted admittance, and calculating the transfer function coefficients from the weighted admittance. Determining the transfer coefficients in this manner may allow for more efficient computation of a transfer function, which may be used to compute interconnect coefficients and delay. Additionally, the transfer coefficients computed in this manner may efficiently take into account multiple attributes of the interconnects, allowing for faster, more accurate computation of the interconnect coefficients and delay Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
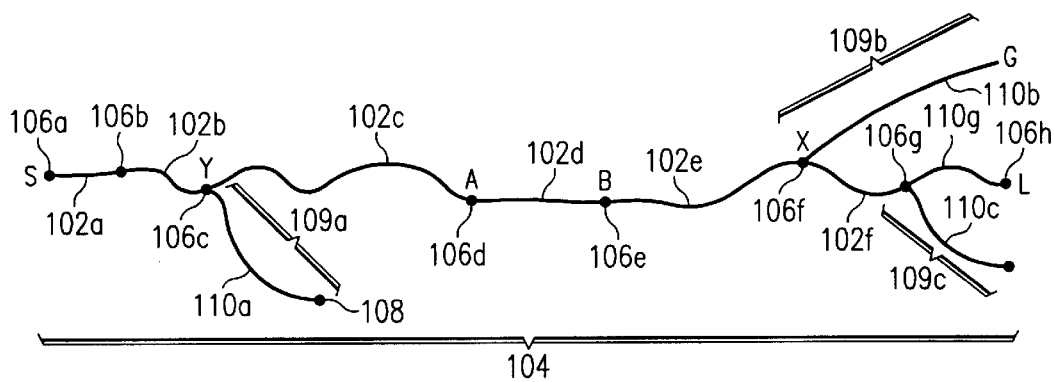
FIG. 1 illustrates a routing tree with an interconnect for which a response and a delay may be calculated.

FIG. 1 illustrates a routing tree 100 with an interconnect for which a response and a delay may be calculated. Routing tree 100 represents, for example, the layout of an integrated circuit such as large-scale integration (LSI), very-large-scale integration (VLSI), super-large-scale integration (SLSI), and ultra-large-scale integration (ULSI) integrated circuits. Routing tree 100 includes nodes 106 and 108 and interconnects 102, 104, and 110 coupling nodes 106 and 108. Nodes 106 and 108 represent elements, for example, transistors, of an integrated circuit, and interconnects 102, 104, and 110 represent the connections between the elements. An interconnect may include other interconnects, for example, interconnect 104 includes interconnects 102. Interconnect 104 has a main path MP(S,L) 104 from node S 106a to node L 106h, where node S 106a is a source node and node L 106h is a load node.

Response describes the behavior of an interconnect in accordance with an applied signal, for example, the response of interconnect 104 describes the behavior at node L 106h in response to a signal applied at node S 106a. Delay describes the time interval between the instant a signal is applied to an interconnect and the instant the interconnect acts accordingly, for example, the time interval between the application of a signal at node S 106a and a response to the signal at node L 106h. A transfer function of an interconnect describes the response and delay of the interconnect. Parameters of an interconnect may be used to determine attributes of the interconnect, which in turn may be useful to derive coefficients, or alternatively moments, of a transfer function. Parameters of an interconnect such as a wire, may include, for example, its length, width, thickness, and dielectric coefficient. The spacing between interconnects may also be included as a parameter. Attributes may include resistance, capacitance, and inductance.

A parent node $\hat{N}$ of node N is a node that is one node closer to source node 106a than is node N. For example, node A 106d is the parent node of node B 106e. A child node $\check{N}$ of node N is a node that is one node closer to load node 106h than is node N. For example, node B 106e is the child node of node A 106d. Subtree T(N) includes the nodes and interconnects rooted at node N. For example, subtree T(Y) 109a includes node 108 and interconnect 110a rooted at node Y 106c. Family F(N) is the set of child nodes of node N. For example, F(Y) is the set of child nodes 106d and 108 of parent node Y 106c.

Capacitance $C_N$ is the capacitance at node N connected to ground. For example, $C_X$ is the capacitance at node X 106f connected to ground. Resistance $R_N$ is the resistance of the segment between node N and its parent $\hat{N}$. For example, $R_B$ is the resistance between node B 106e and node A 106d. Similarly, inductance $L_N$ is the inductance of the branch between node N and its parent $\hat{N}$. For example, $L_B$ is the inductance of the segment between node B 106e and node A 106d.

Figure 2:
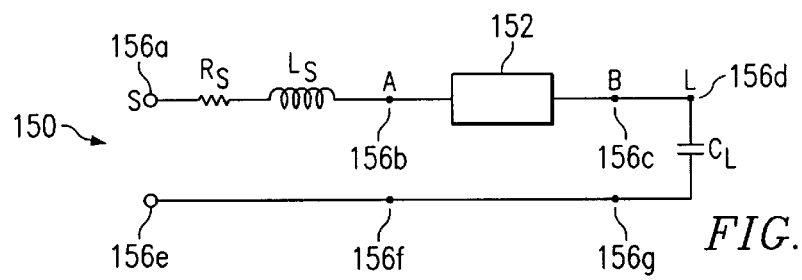
FIG. 2 illustrates an example of an interconnect of FIG. 1.

FIG. 2 illustrates an example of an interconnect 150 for which a response and delay may be calculated. Interconnect 150 includes nodes 156, with source node 156a and load node 156d, and resistance $R_S$, inductance $L_S$, and capacitance $C_L$. Interconnect 150 also includes a distributed resistance-inductance-capacitance (RLC) line 152 with a source impedance $Z_S = R_S + sL_S$ and a load impedance $Z_L = 1/(sC_L)$.

Unlike known systems, the system for calculating interconnect delay and response provides a transfer function with any number, or order, of coefficients describing any number of parameters. Known systems provide transfer functions with only one or two coefficients. An embodiment of a system for calculating response and delay of an interconnect is described in FIG. 3. Examples of interconnects for which transfer coefficients may be calculated are described in FIGS. 4 through 7. An embodiment of a method for calculating a response and delay of an interconnect is described in FIG. 8.

Figure 3:
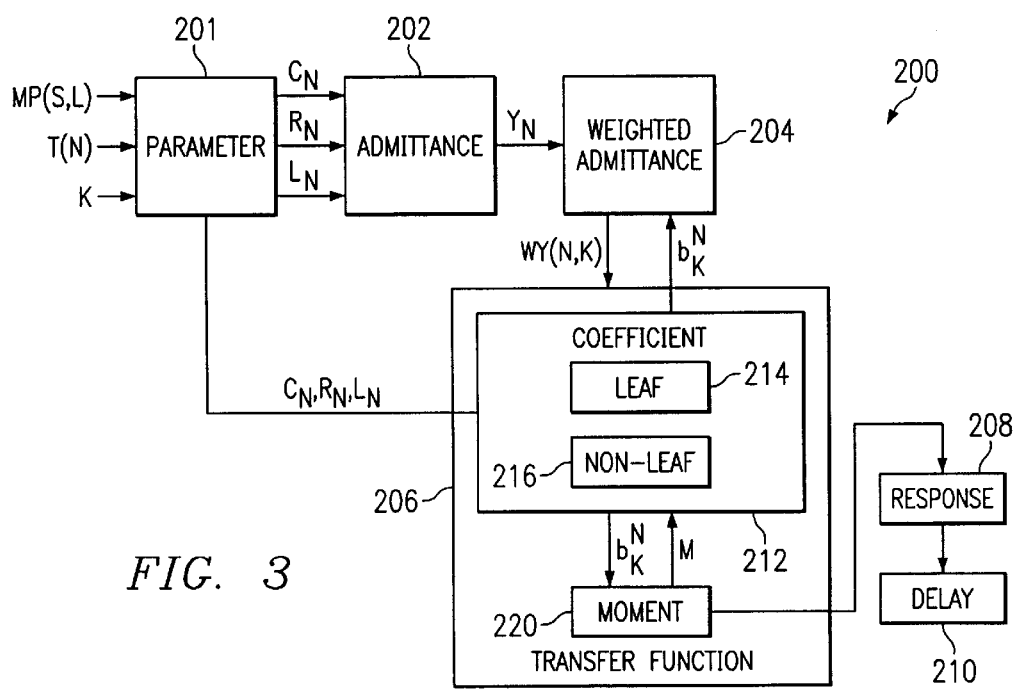
FIG. 3 is a block diagram of one embodiment of a system for calculating interconnect response and delay.

FIG. 3 is a block diagram of one embodiment of a system 200 for calculating interconnect response and delay. System 200 includes a parameter module 201, an admittance module 202, a weighted admittance module 204, a transfer function module 206, a response module 208, and a delay module 210. The modules of system 200 may be any suitable combination of hardware and/or software, and may be separated or combined. System 200 computes the response and delay of an interconnect of a routing tree from a transfer function, given the following input describing the interconnect: the main path MP (S,L) from node S to node L of the interconnect, subtrees T(N) rooted at nodes N of the interconnect, and predetermined order k of the transfer function coefficients.

In one embodiment, lower-case letters f(t) indicate time-domain functions, and upper case letters F(s) indicate transform-domain functions, where s is the Laplace transform variable. Transfer function H(s) from a node 1 to a node N may be expressed using transfer function coefficients $b_k^N$ as described by Equation (1):

$$H(s) = \frac{1}{b_0 + b_1^{N+1} s + b_2^{N+1} s^2 + b_3^{N+1} s^3 + \ldots} \quad (1)$$

or using transfer coefficient moments $M_k$, as described by Equation (2):

$$H(s) = M_0 - sM_1 + s^2 M_2 - s^3 M_3 + \ldots \quad (2)$$

Parameter module 201 extracts resistance, acapacitance, and inductance values from the input describing interconnect 104. The input describes the parameters, for example, length, width, and thickness of interconnect 104.

Admittance module 202 computes the admittance $Y_N$ of nodes N 106a to 106h of interconnect 104. Admittance $Y_N$ of node N may be calculated using Equation (3):

$$Y_N = sC_N \text{ if node has no off-path subtree } T(N) \quad (3)$$

$$Y_N = sC_N + Y_{T(N)} \text{ if node N has an off-path subtree } T(N) \quad (3)$$

where $Y_{T(N)}$ is the admittance of subtree T(N). That is, admittance $Y_N$ is the capacitance $C_N$ of node N if there is no subtree at node N, or the sum of the capacitance $C_N$ of node N and the subtree admittance $Y_{T(N)}$.

Figure 4:
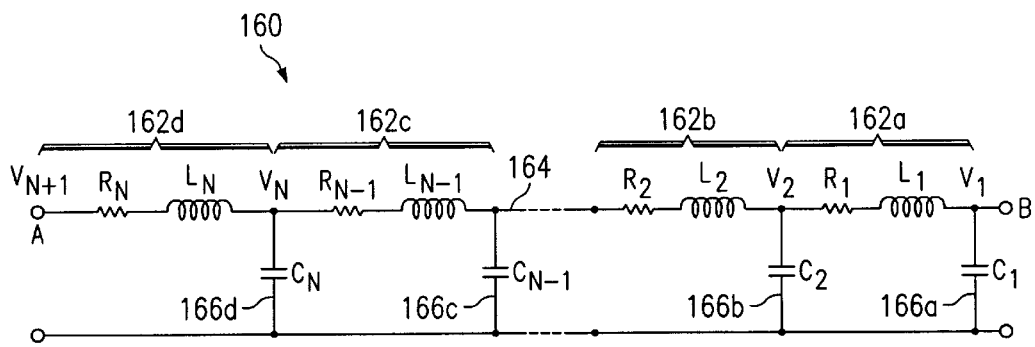
FIGS. 4 through 6 illustrates an interconnect with nodes for which admittance may be computed.
Figure 5:
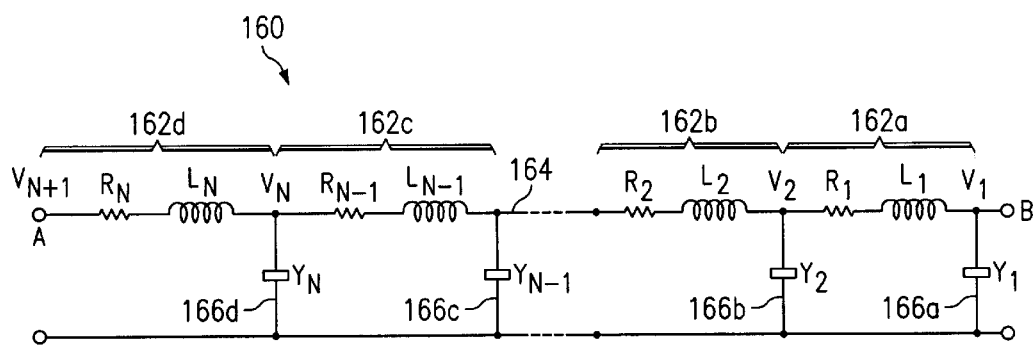

FIGS. 4 and 5 illustrate one example of an N-segment interconnect 160 for which admittance may be calculated. FIG. 4 illustrates interconnect 160 modeled using RLC segments. Interconnect 160 has a main path 164 and off-path subtrees 166, and includes segments 162, each with resistance $R_i$, inductance $L_i$, and capacitance $C_i$. FIG. 5 illustrates interconnect 160 modeled using resistance-inductance-admittance (RLY) segments. Admittance $Y_N$ is the off-path admittance at node i.

Alternatively, admittance module 202 may recursively calculate admittance coefficient $Y_k$ of order k at node N+1 using Equation (4):

$$Y_i = \frac{-1}{b_0} \sum_{j=1}^{i} b_j^{N+1} Y_{(i-j),N+1} + \frac{a_i^{N+1}}{b_0} \quad (4)$$

where $$a_k^{N+1} = C_N b_{k-1}^N + a_k^N = \sum_{j=1}^{N} C_j b_{k-1}^j$$

and $$b_k^{N+1} = R_N \sum_{j=1}^{N} C_j \cdot b_{k-1}^j + L_N \sum_{j=1}^{N} C_j \cdot b_{k-2}^j + b_k^N$$

$$= \sum_{j=1}^{N} C_j b_{k-1}^j \sum_{i=j}^{N} R_i + \sum_{j=1}^{N} C_j b_{k-2}^j \sum_{i=j}^{N} L_i$$

As an example, admittance module 202 calculates the admittance components $Y_{k,N}$ of order k at node N of an interconnect 300 as described in connection with FIG. 6.

Figure 6:
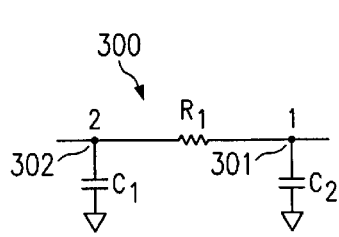

FIG. 6 illustrates an interconnect 300. Interconnect 300 has nodes 1 301 and node 2 302. Equations (5) describe admittance components $Y_{k,N}$ of order k at node N:

$$Y_{1,1} = \alpha_1^1 = C_1$$

$$Y_{1,2} = \alpha_1^2 = C_1 + C_2$$

$$Y_{2,1} = -b_1^1 + \alpha_2^1 = 0$$

$$Y_{2,2} = -b_1^2 \alpha_1^2 + \alpha_2^2 = -R_1 C_1^2 \quad (5)$$

where $$\alpha_1^1 = C_1$$

$$\alpha_1^2 = C_1 + C_2$$

$$\alpha_2^1 = 0$$

$$\alpha_2^2 = 0$$

$$\alpha_2^3 = C_1 b_1^1 + C_2 b_1^2 = R_1 C_1 C_2$$

The admittance $Y_N$ at node N is described by Equation (6):

$$Y_2(s) = sY_{1,2} + s^2 Y_{2,2} = s(C_1 + C_2) - s^2 R_1 C_1^2 \quad (6)$$

Referring back to FIG. 3, weighted admittance module 204 recursively computes the weighted admittance $WY^N$ of order k at node N. To perform the computation, weighted admittance module 204 uses admittance $Y_N$ received from admittance module 202 and transfer function coefficient $b_k^N$ received from transfer function module 206. The weighted admittance $WY_k^N$ may be recursively calculated using Equation (7):

$$WY_k^N = \sum_{l=1}^{k} \sum_{j=1}^{N} Y_{l,j} b_{k-l}^j \quad (7)$$

$$= \sum_{l=1}^{k} \sum_{j \in T(N)} Y_{l,j} b_{k-l}^j = \sum_{l=1}^{k} Y_{l,N} b_{k-l}^N + \sum_{l=1}^{k} \sum_{j \in T(N-1)} Y_{l,j} b_{k-l}^j$$

$$= \sum_{l=1}^{k} Y_{l,N} b_{k-l}^N + WY_k^{N-1}$$

Transfer function module 206 recursively computes the transfer function coefficients $b_k^N$ and moments $M_k$ of order k at node N, and also computes a transfer function from coefficients $b_k^N$ and moments $M_k$. To compute coefficients $b_k^N$, coefficient module 212 uses capacitance $C_N$, resistance $R_N$, and inductance $L_N$ at node N from parameter module 201 and previous transfer function coefficients $b_j^N$, for j=1 to k-1. If node N is a leaf node, a leaf module 214 computes transfer function coefficient $b_k^N$. Leaf module 214 may use Equations (8) to compute transfer function coefficient $b_k^N$ at a leaf node N:

$$b_k^N = 0 \text{ if } k > 1$$

$$b_k^N = 1 \text{ if } k = 1 \quad (8)$$

If node N is a non-leaf node, a non-leaf module 216 recursively computes the transfer function coefficient $b_k^N$. Non-leaf module 216 may use Equation (9) to compute transfer function coefficient $b_k^N$:

$$b_k^{N+1} = b_k^N + b_k^M + R_N WY_{K-1}^N + L_N WY_{K-2}^N \quad (9)$$

where node M is the parent node $\hat{N}$ of node N. As an example, coefficient module 212 computes coefficients $b_k^N$ for an interconnect 400 as described in connection with FIG. 7.

Figure 7:
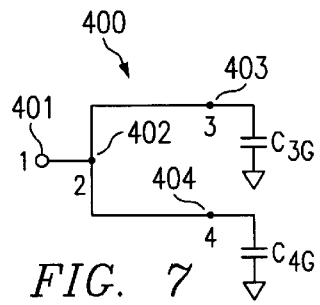
FIG. 7 illustrates an interconnect with nodes for which transfer coefficients may be computed.

FIG. 7 illustrates an interconnect 400. Interconnect 400 has nodes 1 401, 2 402, 3 403, and 4 404. Admittance module 202 calculates the admittance components $Y_{k,n}$ of order k at node N, as described by Equations (10):

$$Y_{1,2} = C_{24} + C_{4G}$$

$$Y_{2,2} = -R_{24}(C_{24} + C_{4G})^2 \quad (10)$$

where $C_{xy}$, $R_{xy}$, and $L_{xy}$ are the capacitance, resistance, and inductance, respectively, between nodes x and y, and where G is ground. Coefficient module 212 calculates $b_1^N$ of order 1 at nodes 1, 2, 3, as described by Equations (11):

$$b_1^3 = 0$$

$$b_1^2 = R_{23} Y_{1,3} = R_{23}(C_{23} + C_{3G})$$

$$b_1^1 = R_{12} Y_{1,2} + b_1^2 = R_{12}(C_{12} + C_{23} + C_{24} + C_{3G} + C_{4G}) \quad (11)$$

and $b_2^N$ of order 2 at nodes 1, 2, 3, as described by Equations (12):

$$b_2^3 = 0$$

$$b_2^2 = L_{23} Y_{1,3} = L_{23}(C_{23} + C_{3G})$$

$$b_2^1 = R_{12} \cdot (C_{12} + Y_{1,2}) b_1^2 + R_{12} \cdot Y_{2,2}$$

$$+ L_{23} \cdot (C_{12} + Y_{1,2} + Y_{1,3}) + b_2^2$$

$$= R_{12} R_{23}((C_{12} + C_{24} + C_{4G})(C_{23} + C_{3G}) -$$

$$R_{12} R_{24}(C_{24} + C_{4G})^2 + L_{23}(C_{12} + C_{24} + C_{4G} + {23} + C_{3G})$$

$$+ L_{23} + C_{3G}) \quad (12)$$

Referring back to FIG. 3, moment module 220 computes the moments $M_k$ of the transfer function from the transfer function coefficients $b_k^N$. Transfer function H(s) may be expressed using moments $M_k$ or coefficients $b_k^N$ as shown by Equations (1) and (2). Moment module 220 may use Equation (13) to calculate moments $M_k$ from coefficients $b_k^N$:

$$M_k = (-1)^{k+1} \sum_{i=1}^{k} (-1)^{k-i} b_i M_{k-i} \quad (13)$$

$$b_k = -\sum_{i=1}^{k} (-1)^i M_i b_{k-i}$$

The first and second moments $M_1$ and $M_2$ of the transfer function may be obtained from the coefficients $b_1$ and $b_2$, i.e., $M_1 = b_1$ and $M_2 = b_1^2 - b_2$. Transfer function module 206 may compute a transfer function from coefficients $b_k^N$ and moments $M_k$ using Equations (1) and (2).

Response module 208 computes the interconnect response from the transfer function computed by transfer function module 206, and delay module 210 computes the interconnect delay from the response computed by response module 208, as described in greater detail below. The response and delay may be calculated for finite and infinite ramp inputs. Moreover, unlike with known systems, the response and delay may be calculated for any order k.

In one embodiment, the transfer function H(s) is approximated to order k=1, as expressed by Equation (14):

$$H(s) \approx \frac{1}{1+sb_1} \quad (14)$$

The response $U_{out}(s)$ under an infinite ramp input may be described by Equation (15):

$$U_{out}(s) = \frac{V_0}{T_R} \frac{1}{s^2} \frac{1}{(1+sb_1)} = \frac{V_0}{T_R}\left[\frac{1}{s^2} - \frac{b_1}{s} + \frac{b_1}{(s+1/b_1)}\right] \quad (15)$$

where $V_0$ is the steady state voltage and $T_R$ is the rise time. The rise time $T_R$ may be, for example, between 100 ps to 400 ps. Equation (16) describes the corresponding delay $u_{out}(t)$ under an infinite ramp input if the ramp delay is less than the rise time $T_R$:

$$u_{out}(t) = \frac{V_0}{T_R}\left[-b_1 + t + b_1 e^{\frac{-t}{b_1}}\right] \quad (16)$$

The delay $V_{out}(t)$ under a finite ramp input may be described by Equation (17) if the ramp delay is greater than the rise time $T_R$:

$$v_{out}(t) = u_{out}(t) - u_{out}(t - T_R) \quad (17)$$

$$= \frac{V_0}{T_R}\left[T_R + b_1 e^{\frac{-t}{b_1}} - b_1 e^{\frac{-(t-T_R)}{b_1}}\right]$$

Voltage $U_{TR}$ is the threshold voltage at which the delay through the interconnect is equal to rise time $T_R$, and is described by Equation (18):

$$v_{T_R} = \left[1 - \frac{b_1}{T_R}\left(1 - e^{\frac{-1}{b_1/T_R}}\right)\right] \quad (18)$$

Voltage $V_{th}$ is the threshold voltage for the finite ramp response expressed as a fraction of the steady state ad voltage $V_0$. If $V_{th} \leq V_{TR}$, delay may be calculated using infinite ramp input response $u_{out}(t)$ given by Equation (16), and if $V_{th} > V_{TR}$, delay may be calculated using finite ramp response $V_{out}(t)$ given by Equation (17).

In one embodiment, the transfer function H(s) is approximated to order k=2, that is, to the $s^2$ term, by Equation (19):

$$H(s) \approx \frac{1}{1+sb_1+s^2b_2}. \quad (19)$$

The response $U_{out}(s)$ under an infinite ramp input may be described by Equation (20):

$$U_{out}(s) = \frac{V_0}{T_R} \frac{1}{s^2} \frac{1}{1+sb_1+s^2b_2} \quad (20)$$

-continued $$= \frac{V_0}{T_R}\left[\frac{-b_1}{s} + \frac{1}{s^2} - \frac{1+b_1 s_2}{s_1-s_2}\frac{1}{s-s_1} + \frac{1+b_1 s_1}{s_1-s_2}\frac{1}{s-s_2}\right]$$

The corresponding delay $u_{out}(t)$ under an infinite ramp input may be described by Equation (21):

$$u_{out}(t) = \frac{V_0}{T_R}\left[-b_1 + t + \frac{1+b_1 s_2}{s_2-s_1}e^{s_1 t} + \frac{1+b_1 s_1}{s_1-s_2}e^{s_2 t}\right]U(t) \quad (21)$$

where U(t) is the unit step function.

The delay $V_{out}(t)$ under a finite ramp input may be described using Equation (22):

$$v_{out}(t) = u_{out}(t) - u_{out}(t-T_R) \quad (22)$$

$$= \frac{V_0}{T_R}\left[T_R + \frac{(1+b_1 s_2)(e^{s_1 t} - e^{s_1(t-T_R)})}{(s_2-s_1)} + \frac{(1+b_1 s_1)(e^{s_2 t} - e^{s_2(t-T_R)})}{(s_1-s_2)}\right]U(t)$$

where the two poles $S_1$ and $S_2$ of the transfer function H(S) are described by Equation (23):

$$s_{1,2} = \frac{-b_1 \pm \sqrt{b_1^2 - 4b_2}}{2b_2} \quad (23)$$

$$= \frac{2}{-M_1 \pm \sqrt{4M_2 - 3M_1^2}}$$

The poles $S_1$ and $S_2$ of the transfer function H(S) are real if $(b_1^2 - 4b_2)+(4M_2 - 3M_1^2) \geq 0$. The magnitude $|S_2|$ is greater than $|S_1|$, so the second term in the delays decreases rapidly compared to the first term. Hence, the infinite ramp input response $u_{out}(t)$ for real poles may be approximated using Equation (24):

$$u_{out}(t) \approx \frac{V_0}{T_R}\left[-b_1 + t + \frac{1+b_1 s_2}{s_2-s_1}e^{s_1 t}\right] \quad (24)$$

The finite ramp input response $V_{out}(t)$ may be approximated using Equation (25):

$$v_{out}(t) \approx \frac{V_0}{T_R}\left[T_R + \frac{1+b_1 s_2}{s_2-s_1}(e^{s_1 t} - e^{s_1(t-T_R)})\right] \quad (25)$$

If $V_{th} \leq V_{TR}$, the delay $T_D$ at the threshold voltage $V_{th}$ may be calculated using Equation (26):

$$T_D + \frac{1+b_1 s_2}{s_2-s_1}e^{s_1 T_D} = v_{th}T_R + b_1 \quad (26)$$

Equation (26) may be solved using sample back-substitution with the analytical delay $T_{AD} = T_R 2 + b_1$ as the starting value. Alternatively, Equation (26) may be solved by substituting a function $f(T_{AD})$ for delay $T_D$ in the exponential term, which is shown by Equation (27):

$$T_D = v_{th}T_R + b_1 - \frac{1-b_1 s_2}{s_2-s_1}e^{s_1 f(T_{AD})} \quad (27)$$

where $f(T_{AD})$ depends on the threshold voltage $V_{th}$ and analytical delay $T_{AD}$. For example, for a 50% threshold voltage $V_{th}$, function $f(T_{AD})=T_{AD}$, and for 90% threshold voltage $V_{th}$, function $f(T_{AD})=2.3\ T_{AD}$. Alternatively, function $f(T_{AD})$ may be obtaining using $T_D=V_{th}T_R+\tau_D$.

If $V_{th}>V_{TR}$, the delay $T_D$ at threshold voltage $V_{th}$ may be calculated using Equation (28):

$$v_{th}T_R = T_R - \frac{1+b_1s_2}{s_2-s_1}(e^{-s_1T_R}-1)e^{s_1T_D} \tag{28}$$

The pole $S_1$ is negative, so the quantity $(e^{-S_1T_R}-1)$ is positive and the residue $$\frac{1+b_1s_2}{s_2-s_1}$$

is also positive. Accordingly, the delay may be expressed using Equation (29):

$$T_D = \frac{1}{|s_1|}\left|\ln\left(\frac{F_3}{(1-v_{th})}\right)\right| \tag{29}$$

where $$F_3 = \frac{(1+b_1s_2)(e^{|s_1|T_R}-1)}{(s_2-s_1)T_R}.$$

Figure 8:
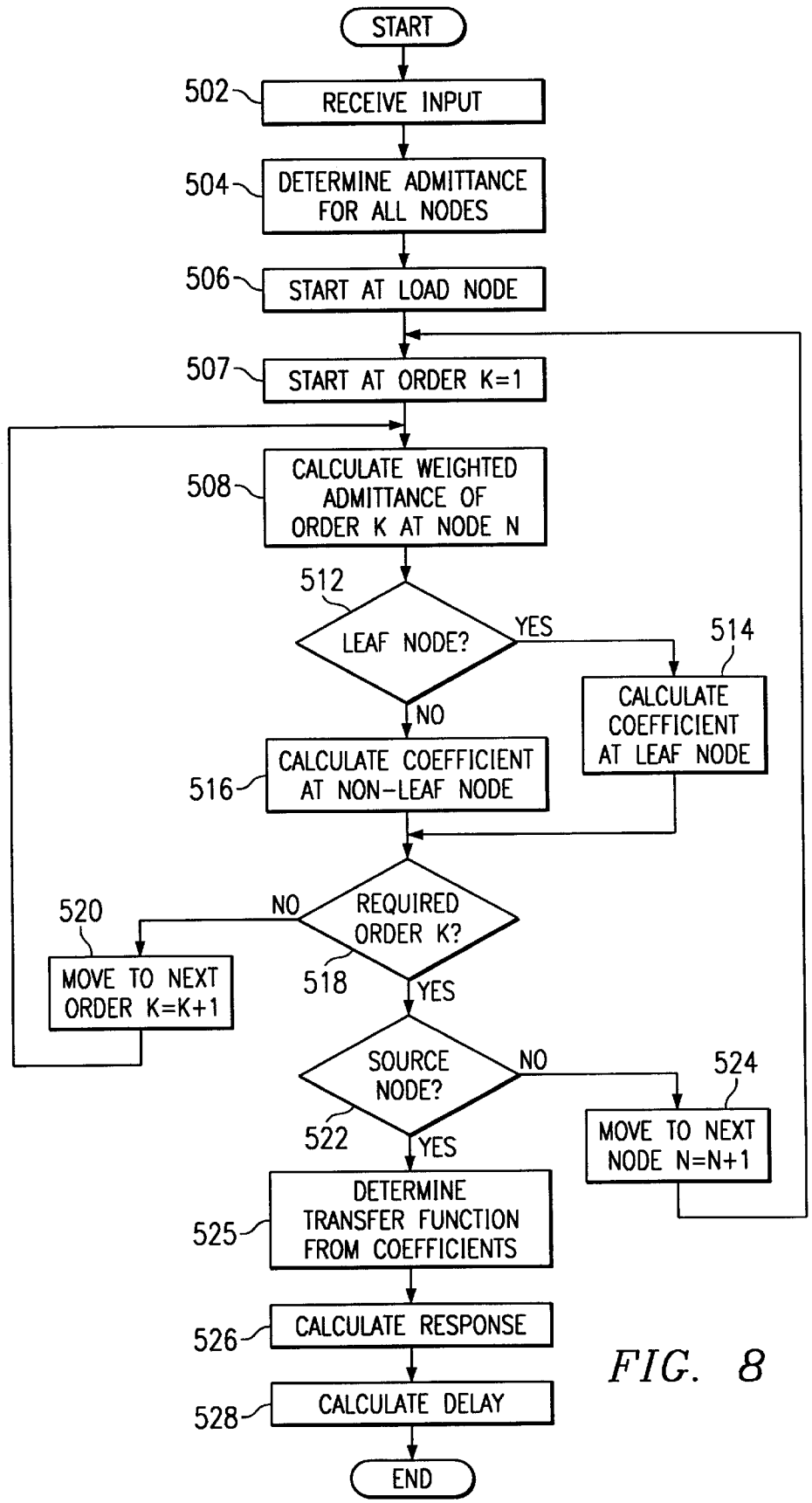
FIG. 8 is a flowchart illustrating one embodiment of a method for calculating interconnect response and delay.

FIG. 8 is a flowchart illustrating one embodiment of a method for calculating interconnect response and delay. FIG. 1 is used as an example, but any other arrangement may be used.

The method begins at step 502, where system 200 receives input describing interconnect 104, including main path MP(S,L) from node S 106a to node L 106h, subtrees T(N) 109 routed at nodes N, and predetermined order k. Parameter module 201 extracts resistance, capacitance, and inductance values from the input at step 502. Admittance module 202 recursively computes admittance $Y_N$ of node N for nodes 106a to 106h along main path MP(S,L) of interconnect 104 at step 504.

The coefficients $b_k^N$ of a transfer function describing interconnect 104 are calculated at steps 506 through 520. In general, the coefficients $b_k^N$ are computed from load to source for any order k. The calculation begins at the load node, node L 106h, at step 506, and at order k=1, at step 507. Weighted admittance module 204 computes the weighted admittance $WY_k^N$ of order k at node N at step 508. Transfer function module 206 computes the transfer function coefficient $b_k^N$ of order k at node N at steps 512 through 524. Transfer function module determines whether node N is a leaf node at step 512. If node N is a leaf node at step 512, the method proceeds to step 514, where leaf module 214 computes transfer function coefficient $b_k^N$ at leaf node N. After computing coefficient $b_k^N$, the method proceeds to step 518. If node N is a non-leaf node at step 512, non-leaf module 216 computes the transfer function coefficient $b_k^N$ at non-leaf node N at step 516. After computing coefficient $b_k^N$, the method proceeds to step 518.

The method determines whether predetermined order k has been reached at step 518. If predetermined order k has not been reached at step 518, the method proceeds to step 520, where the method moves to the next order k=k+1. The method returns to step 508, where weighted admittance $WY_k^m$ of order k at node N is calculated. If predetermined order k has been reached at step 518, the method proceeds to step 522.

The method determines whether node N is the source node 106a, indicating that computation of coefficients $b_k^N$ is complete, at step 522. If node N is not a source node at step 522, the method proceeds to step 524, where the method moves from node N to the next node, the parent node $\hat{N}$ of node N. The method then returns to step 507, where the weighted admittance $WY_k^N$ of order k=1 at node N is calculated. If node N is a source node at step 522, the method proceeds to step 525, where a transfer function is determined from coefficients $b_k^N$. At step 526, response module 208 calculates the response for the interconnect. Delay module 210 calculates the interconnect delay from the response computed by response module 208 at step 528. After computing the delay, the method terminates.

Although an embodiment of a system and method for calculating interconnect response and delay and their advantages are described in detail, a person skilled in the art could make various alterations, additions, and omissions without departing from the spirit and scope of the system and method as defined by the appended claims.

What is claimed is:

1. A method for calculating interconnect response, the method comprising:

determining at least one attribute for each node of an interconnect, the interconnect comprising a plurality of nodes;

determining an admittance of each node from the attributes;

determining a transfer function coefficient for each node by repeating the following steps until the transfer function coefficient for each node has been calculated for a predetermined order:

calculating a weighted admittance of a current determined admittance of the node;

calculating a transfer function coefficient of determined weighted admittance;

determining a transfer function from the transfer function coefficients; and calculating an interconnect response according to the transfer function.

2. The method of claim 1, wherein the interconnect comprises a very-large-scale integration integrated circuit.

3. The method of claim 1, wherein determining at least one attribute comprises determining a resistance and a capacitance from input describing the interconnect.

4. The method of claim 1, wherein determining an admittance comprises:

repeating the following steps until a next order is equal to the predetermined order:

calculating an admittance coefficient for a current order; and calculating an admittance coefficient for the next order according to the admittance coefficient for the current order; and determining an admittance of a node from the calculated admittance coefficients.

5. The method of claim 1, wherein determining an admittance comprises:

repeating the following steps until a next order is equal to the predetermined order:

calculating a transfer function coefficient for a current order; and calculating an admittance coefficient for the next order according to the transfer function coefficient for the current order; and determining an admittance of a node from the calculated admittance coefficients.

6. The method of claim 1, wherein calculating a weighted admittance of a current node comprises the following steps:
  calculating an admittance coefficient of a current node;
  calculating a transfer function coefficient of the current node; and
  determining the weighted admittance of the current node according to a product of the admittance coefficient and the transfer function coefficient.

7. The method of claim 1, wherein determining a transfer function coefficient comprises repeating the following steps until a transfer function coefficient has been calculated for each node:
  calculating a transfer function coefficient of a current node;
  calculating a weighted admittance of the current node according to the transfer function coefficient of the current node and the admittance of the current node;
  calculating a transfer function coefficient of the next node according to the weighted admittance of the current node.

8. The method of claim 1, wherein determining a transfer function coefficient comprises repeating the following steps until a current order is equal to the predetermined order:
  calculating a transfer function coefficient for a current order; and
  calculating a transfer function coefficient for a next order according to the transfer function coefficient for the current order.

9. The method of claim 1, wherein determining a transfer function coefficient comprises:
  determining whether a node is a leaf node; and
  calculating the transfer function coefficient of the node as a constant.

10. The method of claim 1, further comprising calculating an interconnect delay according to the interconnect response.

11. A system for calculating interconnect response, the system comprising:
  a parameter module operable to determine at least one attribute for each node of an interconnect, the interconnect comprising a plurality of nodes;
  an admittance module operable to determine an admittance of each node from the attributes;
  a weighted admittance module operable to calculate a weighted admittance of a determined admittance of the node;
  a transfer function module operable to calculate a transfer function coefficient for calculated weighted admittance and to determine a transfer function from the transfer function coefficients for a predetermined order; and
  a response module operable to calculate an interconnect response according to the transfer function.

12. The system of claim 11, wherein the interconnect comprises a very-large-scale integration integrated circuit.

13. The system of claim 11, wherein the parameter module is operable to:
  receive input describing the interconnect; and
  determine a resistance and a capacitance from the input.

14. The system of claim 11, wherein the admittance module is operable to:
  repeat the following steps until a next order is equal to the predetermined order:
    calculate an admittance coefficient for a current order; and
    calculate an admittance coefficient for the next order according to the admittance coefficient for the current order; and
  determine an admittance of a node from the calculated admittance coefficients.

15. The system of claim 11, wherein the weighted admittance module is operable to:
  receive an admittance coefficient of a node from the admittance module;
  receive a transfer function coefficient of the node from the transfer function coefficient module; and
  determine the weighted admittance of the node according to a product of the admittance coefficient and the transfer function coefficient.

16. The system of claim 11, wherein the transfer function coefficient module is operable to repeat the following steps until a transfer function coefficient has been calculated for each node:
  calculate a transfer function coefficient of a current node;
  receive a weighted admittance of the current node from the weighted admittance module; and
  calculate a transfer function coefficient of the next node according to the weighted admittance of the current node.

17. The system of claim 11, wherein the transfer function coefficient module is operable to repeat the following steps until a current order is equal to the predetermined order:
  calculate a transfer function coefficient for a current order; and
  calculate a transfer function coefficient for a next order according to the transfer function coefficient for the current order.

18. The system of claim 11, wherein the transfer function coefficient module is operable to:
  determine whether a node is a leaf node; and
  calculate the transfer function coefficient of the node as a constant.

19. The system of claim 11, further comprising a delay module operable to calculate an interconnect delay according to the interconnect response.

20. Interconnect response calculation software embodied in a computer-readable medium and operable to perform the following steps:
  determining at least one attribute for each node of an interconnect, the interconnect comprising a plurality of nodes;
  determining an admittance of each node from the attributes;
  determining a transfer function coefficient for each node by repeating the following steps until the transfer function coefficient for each node has been calculated for a predetermined order:
    calculating a weighted admittance of a current determined admittance of the node;
    calculating a transfer function coefficient of calculated weighted admittance;
  determining a transfer function from the transfer function coefficients; and
  calculating an interconnect response according to the transfer function.

21. The software of claim 20, wherein the interconnect comprises a very-large-scale integration integrated circuit.

22. The software of claim 20, wherein determining at least one attribute comprises determining a resistance and a capacitance from input describing the interconnect.

23. The software of claim 20, wherein determining an admittance comprises:
repeating the following steps until a next order is equal to the predetermined order:
calculating an admittance coefficient for a current order; and
calculating an admittance coefficient for the next order according to the admittance coefficient for the current order; and
determining an admittance of a node from the calculated admittance coefficients.

24. The software of claim 20, wherein determining an admittance comprises:
repeating the following steps until a next order is equal to the predetermined order:
calculating a transfer function coefficient for a current order; and
calculating an admittance coefficient for the next order according to the transfer function coefficient for the current order; and
determining an admittance of a node from the calculated admittance coefficients.

25. The software of claim 20, wherein calculating a weighted admittance of a current node comprises the following steps:
calculating an admittance coefficient of a current node;
calculating a transfer function coefficient of the current node; and
determining the weighted admittance of the current node according to a product of the admittance coefficient and the transfer function coefficient.

26. The software of claim 20, wherein determining a transfer function coefficient comprises repeating the following steps until a transfer function coefficient has been calculated for each node:
calculating a transfer function coefficient of a current node;
calculating a weighted admittance of the current node according to the transfer function coefficient of the current node and the admittance of the current node; and
calculating a transfer function coefficient of the next node according to the weighted admittance of the current node.

27. The software of claim 20, wherein determining a transfer function coefficient comprises repeating the following steps until a current order is equal to the predetermined order:
calculating a transfer function coefficient for a current order; and
calculating a transfer function coefficient for a next order according to the transfer function coefficient for the current order.

28. The software of claim 20, wherein determining a transfer function coefficient comprises:
determining whether a node is a leaf node; and
calculating the transfer function coefficient of the node as a constant.

29. The software of claim 20, further comprising calculating an interconnect delay according to the interconnect response.

* * * * *